(12) United States Patent
Loberg et al.

(10) Patent No.: US 10,783,284 B2
(45) Date of Patent: Sep. 22, 2020

(54) VIRTUAL REALITY IMMERSION WITH AN ARCHITECTURAL DESIGN SOFTWARE APPLICATION

(71) Applicant: DIRTT ENVIRONMENTAL SOLUTIONS, INC., Salt Lake City, UT (US)

(72) Inventors: Barrie Loberg, Millarville (CA); Joseph Howell, Uintah, UT (US); Robert Blodgett, Salt Lake City, UT (US); Sheldon Smith, Clagary (CA); Tyler West, Calgary (CA)

(73) Assignee: DIRTT Environmental Solutions, LTD. (CA)

(*) Notice: Subject to any disclaimer, the term of this patent is extended or adjusted under 35 U.S.C. 154(b) by 0 days.

(21) Appl. No.: 15/518,378

(22) PCT Filed: Oct. 14, 2015

(86) PCT No.: PCT/US2015/055587
§ 371 (c)(1),
(2) Date: Apr. 11, 2017

(87) PCT Pub. No.: WO2016/061267
PCT Pub. Date: Apr. 21, 2016

(65) Prior Publication Data
US 2017/0308626 A1    Oct. 26, 2017

Related U.S. Application Data

(60) Provisional application No. 62/064,156, filed on Oct. 15, 2014.

(51) Int. Cl.
*G06F 30/13* (2020.01)
*G06F 3/01* (2006.01)
(Continued)

(52) U.S. Cl.
CPC .......... *G06F 30/13* (2020.01); *G02B 27/017* (2013.01); *G06F 3/011* (2013.01); *G06F 3/012* (2013.01);
(Continued)

(58) Field of Classification Search
CPC ...... G06F 17/5004; G06F 3/013; G06F 3/011; G06F 3/012; G06F 3/0346; G02B 27/017
See application file for complete search history.

(56) References Cited

U.S. PATENT DOCUMENTS

| 2002/0033845 A1 | 3/2002 | Elber et al. |
| 2005/0276444 A1 | 12/2005 | Zhou et al. |

(Continued)

FOREIGN PATENT DOCUMENTS

| CN | 102495959 | 6/2012 |
| EP | 2662839 | 11/2013 |

(Continued)

OTHER PUBLICATIONS

International Search Report and Written Opinion for PCT/US2015/05587 dated Jan. 27, 2016.

(Continued)

*Primary Examiner* — Sherrod L Keaton
(74) *Attorney, Agent, or Firm* — Workman Nydegger

(57) ABSTRACT

A virtual reality system can comprise a virtual reality headset, one or more position tracking sensors, and a computerized architectural design environment. The position tracking sensors can identify a relative location of the user with respect to a physical space. The computerized architectural design environment can comprise a computer-implemented method for displaying a three-dimensional view of an architectural design to a user through the one or more virtual reality components. The method can comprise receiving a communication from the one or more position (Continued)

tracking sensors, rendering at least a portion of an architectural design file, and transmitting to the virtual reality headset the rendered portion of the architectural design file.

20 Claims, 4 Drawing Sheets

(51) Int. Cl.
*G02B 27/01* (2006.01)
*G06F 3/0346* (2013.01)
*G06F 17/00* (2019.01)

(52) U.S. Cl.
CPC ............ *G06F 3/013* (2013.01); *G06F 3/0346* (2013.01); *G02B 2027/014* (2013.01); *G02B 2027/0141* (2013.01); *G02B 2027/0187* (2013.01); *G06F 17/00* (2013.01)

(56) References Cited

U.S. PATENT DOCUMENTS

| | | |
|---|---|---|
| 2009/0046140 A1 | 2/2009 | Lashmet |
| 2010/0125799 A1 | 5/2010 | Roberts et al. |
| 2010/0253679 A1 | 10/2010 | Vyakhirev |
| 2010/0289817 A1 | 11/2010 | Meier et al. |
| 2012/0212400 A1 | 8/2012 | Border |
| 2012/0268463 A1 | 10/2012 | Loberg |
| 2012/0310602 A1 | 12/2012 | Jacobi |
| 2013/0141421 A1 | 6/2013 | Mount et al. |
| 2013/0179841 A1* | 7/2013 | Mutton ............... G06F 3/04815 715/850 |
| 2013/0278631 A1 | 10/2013 | Border |
| 2013/0286004 A1 | 10/2013 | McCulloch et al. |
| 2013/0300637 A1 | 11/2013 | Smits et al. |
| 2013/0342564 A1 | 12/2013 | Kinnebrew et al. |
| 2014/0114845 A1* | 4/2014 | Rogers .................... G06T 15/08 705/39 |
| 2014/0132595 A1 | 5/2014 | Boulanger |
| 2014/0168261 A1 | 6/2014 | Margolis et al. |
| 2014/0204117 A1 | 7/2014 | Kinnebrew et al. |
| 2014/0221090 A1 | 8/2014 | Mutschler |
| 2014/0237366 A1 | 8/2014 | Poulos et al. |
| 2014/0368532 A1 | 12/2014 | Keane et al. |
| 2015/0097719 A1* | 4/2015 | Balachandreswaran ..................... G01B 11/002 342/147 |
| 2015/0116316 A1* | 4/2015 | Fitzgerald .............. G02B 27/01 345/419 |
| 2015/0235474 A1 | 8/2015 | Mullins |
| 2015/0316985 A1 | 11/2015 | Levesque |
| 2016/0026253 A1 | 1/2016 | Bradski et al. |
| 2016/0077798 A1 | 3/2016 | Pradeep et al. |
| 2016/0148433 A1 | 5/2016 | Petrovskaya |
| 2016/0257000 A1* | 9/2016 | Guerin ................... B25J 9/1605 |
| 2016/0300392 A1* | 10/2016 | Jonczyk ................ G06T 19/003 |
| 2016/0317866 A1* | 11/2016 | Fung ........................ G06F 1/163 |
| 2016/0379418 A1 | 12/2016 | Osborn et al. |
| 2017/0076500 A1 | 3/2017 | Maggiore |
| 2017/0132841 A1 | 5/2017 | Morrison |
| 2017/0268871 A1 | 9/2017 | Tenma et al. |
| 2017/0308626 A1 | 10/2017 | Loberg et al. |

FOREIGN PATENT DOCUMENTS

| | | |
|---|---|---|
| WO | 2014116231 | 7/2014 |
| WO | 2017214576 | 12/2017 |

OTHER PUBLICATIONS

Written Opinion for application No. 11201703011V dated Jun. 26, 2018.
International Search Report and Written Opinion for Application No. 11201703011V dated Nov. 13, 2017.
Mikael Johansson et al: "From BIM to VR—Integrating immersive visualizations in the current design process", FUSION—Proceedings of the 32nd ECAADE Conference—vol. 2 (EXAADE 2014), Sep. 12, 2014 (Sep. 12, 2014), p. 261, XP055473701, ISBN: 978-94-912-0706-8.
Mackinlay J D et al: "Rapid Controlled Movement Through a Virtual 3D Workspace", Computer Hraphics, ACM, US. vol. 24, No. 4, Aug. 6, 1990 (Aug. 6, 1990), pp. 171-176, XP000603087, ISSN: 0097-8930.
Frank Steinicke et al: "Human Walking in Virtual Environments: Perception, Technology, and Applications", May 27, 2014 (May 27, 2041), Springer New York, New York, XP055445675, ISBN: 978-1-4939-0011-4, pp. 221-262, Section 10.3.1: One-to-One Mappings; p. 225.
Supplementary Search Report for application No. EP15850198.1 dated May 22, 2018.
International Search Report and Written Opinion for PCT/US2017/036871 dated Sep. 14, 2017.
Brent Edward Insko et al: "Passive haptics significantly enhances virtual environments," Dec. 31, 2001 (Dec. 31, 2001), XP055662450, ISBN: 978-0-493-17286-6.
Elvins T T et al: "Wordlets—3D Thumbnails for Wayfinding in Virtual Environments," UIST '97. 10th Annual Symposium on User Interface Software and Technology. Proceedings of the ACM Symposium on User Interface Software and Technology. Banff, Alberta, Canada, Oct. 14-17, 1997; [ACM Symposium on User Interface Software and Technolog, Oct. 14, 1997 (Oct. 14, 1997), pp. 21-30, XP001150324 DOI: 10.1145/263407.263504 ISBN: 978-0-89791-881-7.
Summons to Attend Oral Proceedings for European Application No. 15850198, dated Feb. 5, 2020.
Notice of Allowance for U.S. Appl. No. 15/741,487, dated Feb. 7, 2020.
Search Report for European Application No. 17811126, dated Apr. 8, 2019.
Notice of Allowance for U.S. Appl. No. 15/741,487, dated Oct. 9, 2019.
Non-Final Office Action for U.S. Appl. No. 15/741,487, dated Apr. 19, 2019.
Search Report for European Application No. 17811115, dated Feb. 12, 2019.
Notice of Allowance for U.S. Appl. No. 15/741,488, dated Aug. 1, 2019.
Non-Final Office Action for U.S. Appl. No. 15/741,488, dated Apr. 12, 2019.
Non-Final Office Action for European application No. 17811115 dated Jan. 7, 2020.

* cited by examiner

VIRTUAL REALITY IMMERSION WITH AN ARCHITECTURAL DESIGN SOFTWARE APPLICATION

CROSS-REFERENCE TO RELATED APPLICATIONS

The present invention is a 35 U.S.C. § 371 U.S. National Stage of PCT Application No. PCT/US15/55587 filed on Oct. 14, 2015, which claims the benefit of priority to U.S. Provisional Application No. 62/064,456, filed Oct. 15, 2014. The entire content of each of the aforementioned patent applications is incorporated herein by reference.

BACKGROUND OF THE INVENTION

1. Technical Field

The present invention relates generally to computer-aided design or drafting software.

2. Background and Relevant Art

As computerized systems have increased in popularity, so have the range of applications that incorporate computational technology. Computational technology now extends across a broad range of applications, including a wide range of productivity and entertainment software. Indeed, computational technology and related software can now be found in a wide range of generic applications that are suited for many environments, as well as fairly industry-specific software.

One such industry that has employed specific types of software and other computational technology increasingly over the past few years is that related to building and/or architectural design. In particular, architects and interior designers ("or designers") use a wide range of computer-aided design (CAD) software or building information (BIM) software (i.e., "architectural design software applications") for designing the aesthetic as well as functional aspects of a given residential or commercial space. For example, a designer might use a CAD or BIM program to design a building or part of a building, and then utilize drawings or other information from that program to order or manufacture building components.

One particular benefit that is offered by modem CAD and BIM software is the ability to see a three-dimensional rendering of an architectural design. This can provide tremendous value to designers and/or clients who wish to visualize a design before starting the actual building process. For example, in at least one conventional system, a user may be able to view on a computer screen a completely rendered office building. The user may be able to navigate within the three-dimensional renderings such that the user can view different perspectives and locations throughout the design.

While three-dimensional renderings can provide a user with a general idea regarding a final product, conventional three-dimensional renderings suffer for several shortcomings. For example, navigation of conventional three-dimensional renderings can be cumbersome as a user tries to achieve particular views of various features. Additionally, conventional systems may not be able to portray a true scale of a finished product. For example, a user's view of a conventional three-dimensional rendering on a computer screen may fall short on conveying a full appreciation for the scale of a particular feature or design.

Accordingly, there are a number of problems in the art that can be addressed.

BRIEF SUMMARY OF THE INVENTION

Implementations of the present invention comprise systems, methods, and apparatus configured to allow a user to navigate within a three-dimensional rendering of an architectural design. In particular, implementations of the present invention comprise virtual reality components that create a virtual environment that immerses a user. For example, the virtual reality components may comprise a headset that completely covers a user's eyes and tracks the viewing angle of the user's eyes, plus various motion tracking modules that track the user's movements and head position and/or rotation. As such, the virtual reality components can be used to generate a virtual reality environment that allows a user to interact with a architectural design model in new and useful ways.

For example, a virtual reality system can comprise a virtual reality headset, one or more position tracking sensors, and a computerized architectural design environment. The position tracking sensors can identify a relative location of the user with respect to a physical space. The computerized architectural design environment can comprise a computer-implemented method for displaying a three-dimensional view of an architectural design to a user through the one or more virtual reality components. The headset can track the angle of view with respect to the physical space and within the architectural design.

The method can involve receiving a communication from the one or more position tracking sensors. The communication can comprise an indication of a relative direction that the virtual reality headset is facing. The method can also comprise rendering at least a portion of an architectural design file. The rendered portion of the architectural design file can comprise a three-dimensional image that corresponds with the relative direction that the virtual reality headset is facing. One will understand that in at least one implementation, the rendering can comprise a dynamic rendering that creates an impression to a user that he is viewing a live image of a three-dimensional space. Additionally, the method can involve transmitting to the virtual reality headset the rendered portion of the architectural design file.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention extends to systems, methods, and apparatus configured to allow a user to navigate within a three-dimensional rendering of an architectural design. In particular, implementations of the present invention comprise virtual reality components that create a virtual environment that immerses a user. For example, the virtual reality components may comprise a headset that completely covers a user's eyes and tracks the viewing angle of the user's eyes, plus various motion tracking modules that track the user's movements and head position and/or rotation. As such, the virtual reality components can be used to generate a virtual reality environment that allows a user to interact with a architectural design model in new and useful ways.

Accordingly, implementations of the present invention provide a platform for a user to see and move through a virtual reality view of a particular architecture design. Providing such a view to a user has several benefits and overcomes many problems in the art. For example, though three-dimensional rendering has long been to available in architectural design software, oftentimes, it is difficult to get a proper feel for the scale of items when looking at a computer rendering. In contrast to the conventional art, implementations of the present invention will allow a user to view an architectural design, as if the user is within the designed space. Accordingly, the user will receive a real-world impression regarding the scale of the space and accompanying design-features.

Additionally, at least one implementation of the present invention provides a user with an augmented reality experience. For example, in at least one implementation of the present invention, a user can enter a gutted office space that is being designed by an architectural firm. Once in the space, the user can put-on and activate the virtual reality components. The virtual reality components can then immerse the user within a rendering of the office space as designed by the architectural firm. Additionally, as the user physically moves and/or walks through the space, the virtual reality components can render the proper view in accordance with the user's movements. Accordingly, a user can view a virtual rendering of a finished design space, before the space is actually built-out.

Figure 1:
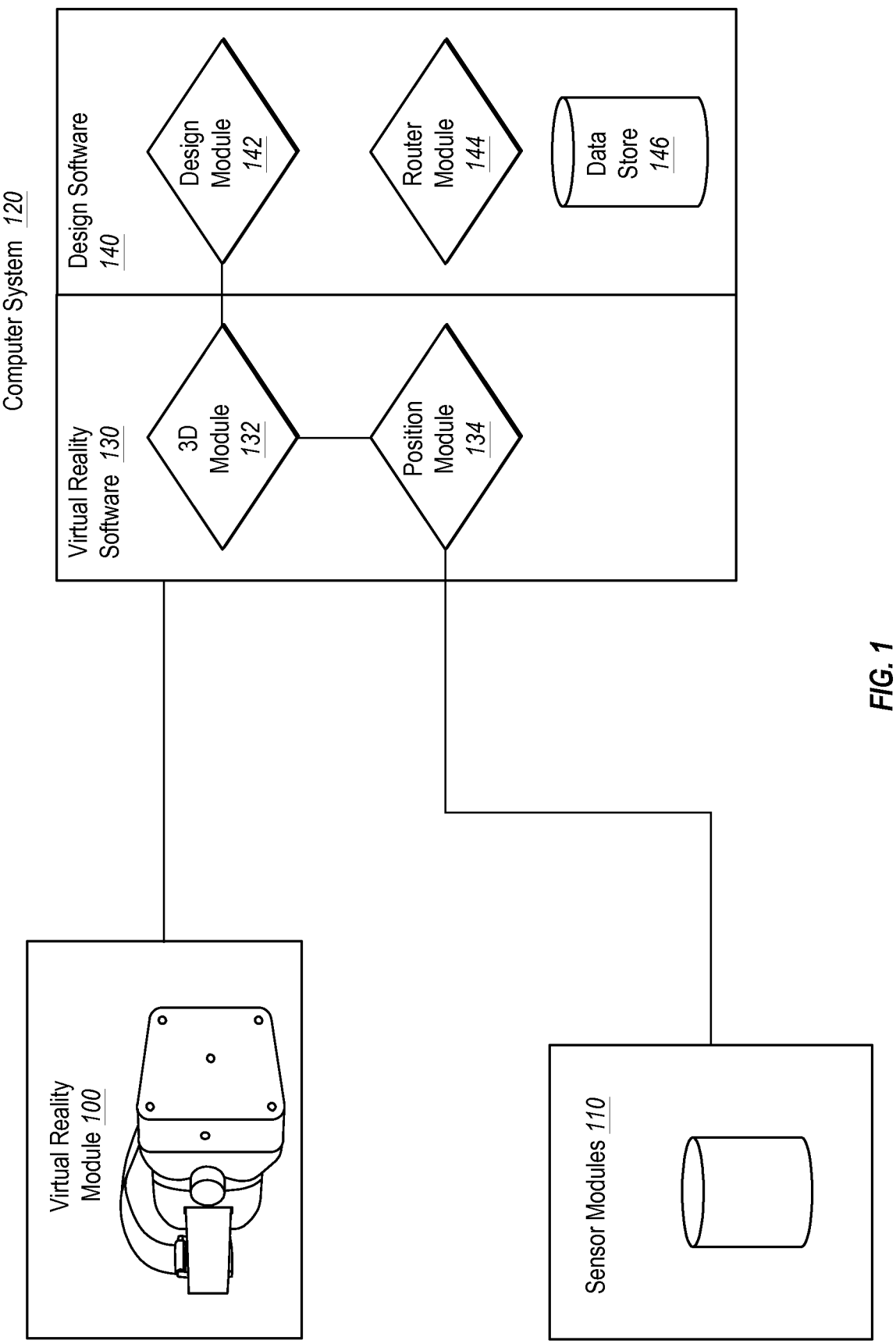
FIG. 1 illustrates a schematic view of a system for displaying a virtual reality rendering of an architectural design in accordance with an implementation of the present invention.

For example, FIG. 1 depicts virtual reality module 100, sensor modules 110, and a computer system 120 in accordance with implementations of the present invention. In at least one implementation, the various components 100, 110, 120 can be in communication wirelessly (e.g., WIFI, BLUETOOTH, LTE, etc.) or physically (e.g., Ethernet, USB, Thunderbolt, HDMI, etc.). Additionally, in at least one implementation, the various components 110, 110, 120 can be otherwise segmented or integrated with respect to each other. For example, in at least one implementation, one or more sensor modules 110 can be integrated within the virtual reality module 100. Similarly, at least a portion of the computer system 120 can likewise be integrated within the virtual reality module 100.

In at least one implementation, the computer system 120 comprises virtual reality software 130 and design software 140. In alternate implementations, however, the virtual reality software 130 and design software 140 can be executed by separate computers or can be executed by the virtual reality module 100 or the sensor modules 110.

The design software 140 can comprise a design module 142, a render module 144, and a data store 146. The design module 142 can provide a designer with the to ability to design and construct a three-dimensional architectural model. In at least one implementation, the designer can create and manipulate a three-dimensional architectural design on a desktop computer. The desktop computer may also be in communication with the virtual reality module 100 and/or the sensor modules 110.

Once an architectural design has been created, a user can view the design on the desktop computer. In particular, the render module 144 can render a three-dimensional view of the architectural design. A user may then be able to navigate through the three-dimensional design on the desktop computer. The architectural design can also be saved to the data store 146, where it can be later accessed.

In accordance with an implementation of the present invention, when a user desires to view a virtual reality rendering of an architectural design, the user can put on a virtual reality module 100. In at least one implementation, a virtual reality module 100 can comprise a headset, or similar device. The headset may completely cover the user's eyes, such that the user is completely visually immersed by images that the headset displays.

Additionally, the user can activate one or more sensor modules 110. In at least one implementation, the one or more sensor modules 110 may comprise a sensor that is disposed within the virtual reality module 100. As such, in at least one implementation, activating the virtual reality module 100 may activate a sensor module 110. The sensor modules 110 may comprise various motion tracking components. For example, the sensor modules 110 can comprise accelerometers, gyroscopes, visual motion tracking, GPS, sonar, magnetic tracking systems, barometric systems, and other position tracking systems. In at least one implementation, one or more sensors may be disposed within the virtual reality module 100, such that the virtual reality module 100 can track some perspective data without requiring external sensor modules 110, or in conjunction with external sensor modules 110.

Once a user has activated the virtual reality module 100 and the sensor modules 110, the virtual reality software 130 can provide the user with a virtual reality depiction of an architectural design. In particular, the 3D module 132 can receive information relating to the architectural design. In at least one implementation, the 3D module 132 can receive a design file (e.g., CAD file), which the 3D module 132 can render. In contrast, in an alternate implementation, the render module 144, within the design software 140, renders at least a portion of the design to file and sends the rendered information to the 3D module 132.

In at least one implementation, the virtual reality software 130 is installed within the virtual reality module 100. Additionally, in at least one implementation, the virtual reality software 130 can function without any direct communication from the design software 140. For example, a design file can be loaded directly into the virtual reality module 100, and the 3D module 132 can render the design file from within the virtual reality module 100.

In contrast, in at least one implementation, the virtual reality module 100 can function primarily as a content delivery (and possibly movement tracking device). In this implementation, the virtual reality software 130 is contained within an external computer system 120. The external computer system 120 can receive the various movement and positional tracking information, render the virtual reality images, and relay the rendered images to the virtual reality module 100. As such, the virtual reality module 100 can simply render the images to the user.

Returning now to the sensor modules 110, the sensor modules 110 and/or the virtual reality module 100 can track a user's relative location and head position. For example, the sensor modules 110 and/or the virtual reality module 100 may be able to determine when a user moves, what direction the user moves, and the direction and position that the user's head is facing. For instance, the sensor modules 110 may detect a user walking in a first direction. In response to detecting this movement, the 3D module 132 may change the image displayed within the 3D module 100 to monitor the user's relative movement through the three-dimensional architectural design.

Additionally, in at least one implementation, the sensor modules 110 and/or the virtual reality module 100 can detect the location, tilt, and position of the user's head. For example, the sensor modules 110 and/or the virtual reality module 100 may detect that a user has crouched. Upon detecting the crouch, the 3D module 132 may change the image displayed within the 3D module 100 to mirror the user's relative position within the three-dimensional architectural design. For instance, the image displayed may now depict the three-dimensional model from a crouching point of view.

Similarly, the sensor modules 110 and/or the virtual reality module 100 may detect that a user has tilted his head. Upon detecting the tilted head, the 3D module 132 may change the image displayed within the 3D module 100 to mirror the user's head's relative position within the three-dimensional architectural design. For instance, the image displayed may depict the three-dimensional model from a tilted point of view.

In at least one implementation, the virtual reality module 100 comprises a headset that is capable of detecting at least when a user rotates his or her head and when the user tilts his or her head. Using this information, in at least one implementation, the virtual reality software 130 can function without the sensor modules 110. For example, the virtual reality software 132 can track the user's head tilt and rotation and provide virtual reality perspectives of a three-dimensional model that corresponds with the detected movements. In at least one implementation, however, the sensor modules 110 may be necessary in order to track a user's longitudinal and latitudinal movements within a physical space and to translate those movements into virtual movement within a virtual three-dimensional design.

In at least one implementation, however, a user can be moved laterally and longitudinally through a virtual three-dimensional design through means other than physical movement that is translated to corresponding virtual movement. For example, in at least one implementation, the user can be moved throughout a three-dimensional design using conventional computer-based tools for navigating within three-dimensional renderings. For instance, the user or another individual can move the user throughout a three-dimensional design using a mouse and/or keyboard to select various positions and perspectives within the three-dimensional design. Accordingly, a user can navigate through a virtual three-dimensional design using only a headset and computer-based navigation.

Returning to the sensor modules 110, in at least one implementation, the sensor module can track the relative position of a user within a physical space, as well as a headset rotation relative to the physical space. For example, a sensor may be placed on the virtual reality module 100. The sensor modules 110 may be able to detect the direction and location of the sensor and thus be able to track the direction that the virtual reality module 100 is facing. Additionally, the sensor modules 110 can also detect the tilt of a headset with respect to a physical space. For example, if a user were to lay down such that the user's head was parallel to the physical floor, in at least one implementation, the sensor modules 110 can detect the tilted position of the user's head relative to the floor.

Figure 2:
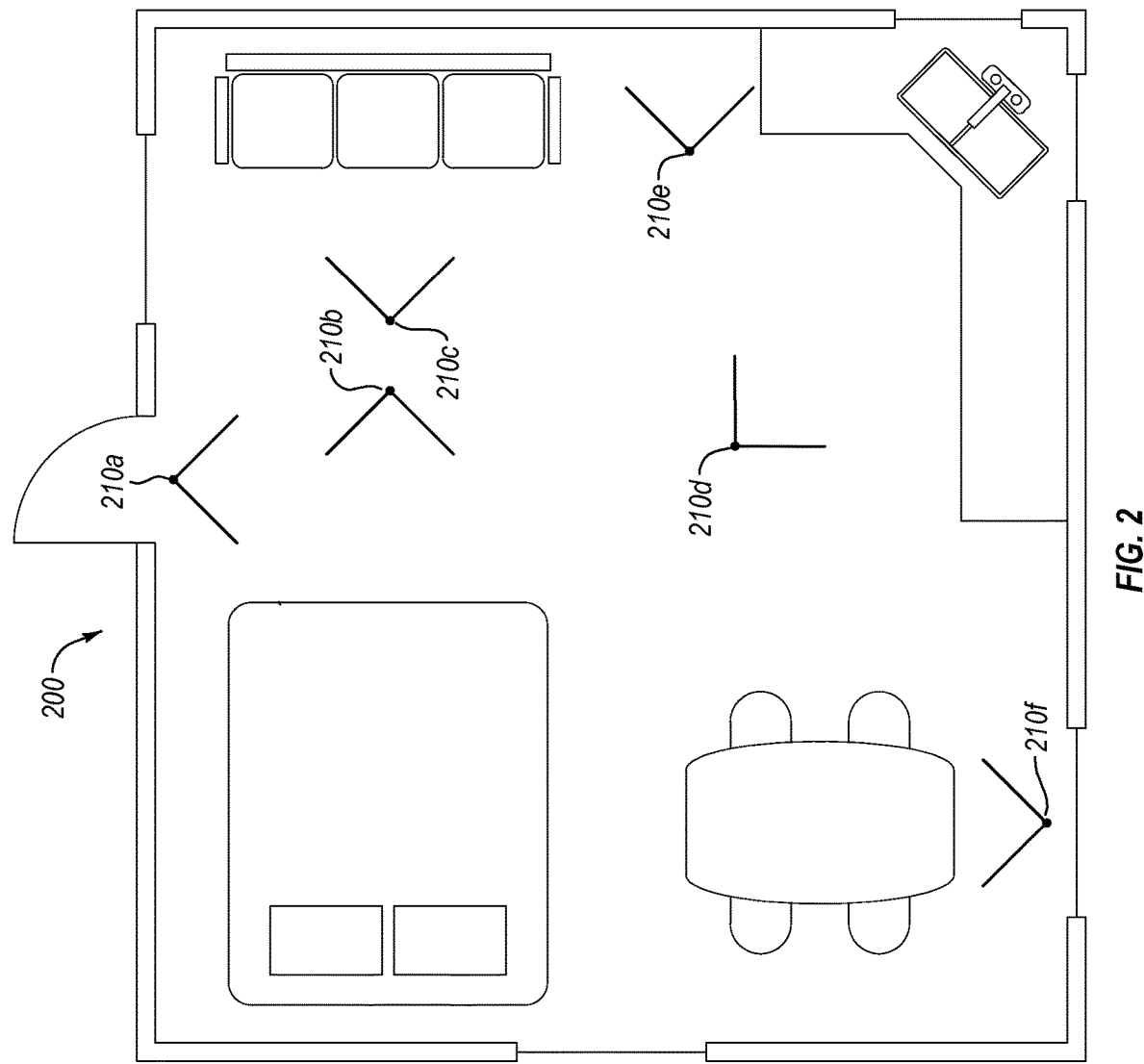
FIG. 2 illustrates a schematic of a studio apartment in accordance with an implementation of the present invention.

For example, FIG. 2 depicts a two dimensional schematic diagram of a studio apartment 200. In at least one implementation, a designer can create a three-dimensional architectural design file that represents the studio apartment. In at least one implementation of the present invention, a designer can place one or more bookmarks 210($a$-$f$) within the architectural design. A bookmark can comprise a particular location and view within the design that the designer wishes to specifically save.

When accessed later the designer, or a user, can return to the bookmarked locations and views 210($a$-$f$). For example, a designer may desire to highlight specific features of the studio apartment 200. For instance, the designer may set a bookmark that views the kitchen 210$d$, a bookmark that views the bed area 210$b$, and a bookmark that views the apartment from the door 210$a$. A user can then access the design file for the studio apartment 200 and move freely within a three-dimensional rendering of the apartment or may move from bookmark to bookmark. For example, a user may desire to see a three-dimensional rendering of the kitchen from bookmark 210$d$. Additionally, a designer may desire to show a client the studio apartment by stepping between the various bookmarks 210($a$-$f$). For example, the designer may progress directly from bookmark 210($a$-$f$) to bookmark 210($a$-$f$) without traveling between the bookmarks 210($a$-$f$) within the three-dimensional rendering.

In at least one implementation, the bookmarks 210($a$-$f$) are also useable within the virtual reality model of the studio apartment 200. A user may be able to move from one bookmark 210($a$-$f$) to another, within the virtual reality rendering, without physically moving. For example, a user may desire to initially view a virtual reality rendering of the sitting area of the studio apartment 200. Accordingly, the user may be placed at bookmark 210$c$ within the virtual reality model. Whereas, in one implementation, a user may be required to physically move in order to travel within the virtual reality model, in this implementation, a user can step between bookmarks without physically moving.

Additionally, in at least one implementation, one or more bookmarks 210($a$-$f$) can be used to give the user a proper starting place within the virtual model with respect to the physical world. For example, the virtual reality model of the studio apartment 210 may comprise a virtual room that is twenty feet wide and fifty feet long. One will understand that in order to allow the user to walk around the virtual studio apartment 200, the user would have to be in a physical space that allows for movement in at least a twenty feet by fifty feet area.

Additionally, one will understand that the position of the user within the virtual studio apartment 200 relative to the user's position in the physical world would also be important. For instance, a user may be positioned within the virtual studio apartment 200 such that the user is in the center of the virtual studio apartment 200. In contrast, the user may be positioned directly next to a wall in the physical world. As such, if a user tried to walk in a particular direction within the virtual studio apartment 200, the user would run into a wall in the physical world.

In at least one implementation, bookmarks can be used to orient a user within the virtual studio 200 relative to the physical world. For example, if the physical room is at least twenty feet wide and fifty feet long, the user can be positioned with his back against one of the walls that is at least fifty feet long. Within the virtual studio apartment 200, the user can then be associated with a bookmark 210a that also has the user's back positioned against a virtual wall that is fifty feet in length. As such, the user can begin navigating within the virtual studio apartment 200 from a position that corresponds with an equivalent position within the physical world.

Figure 3:
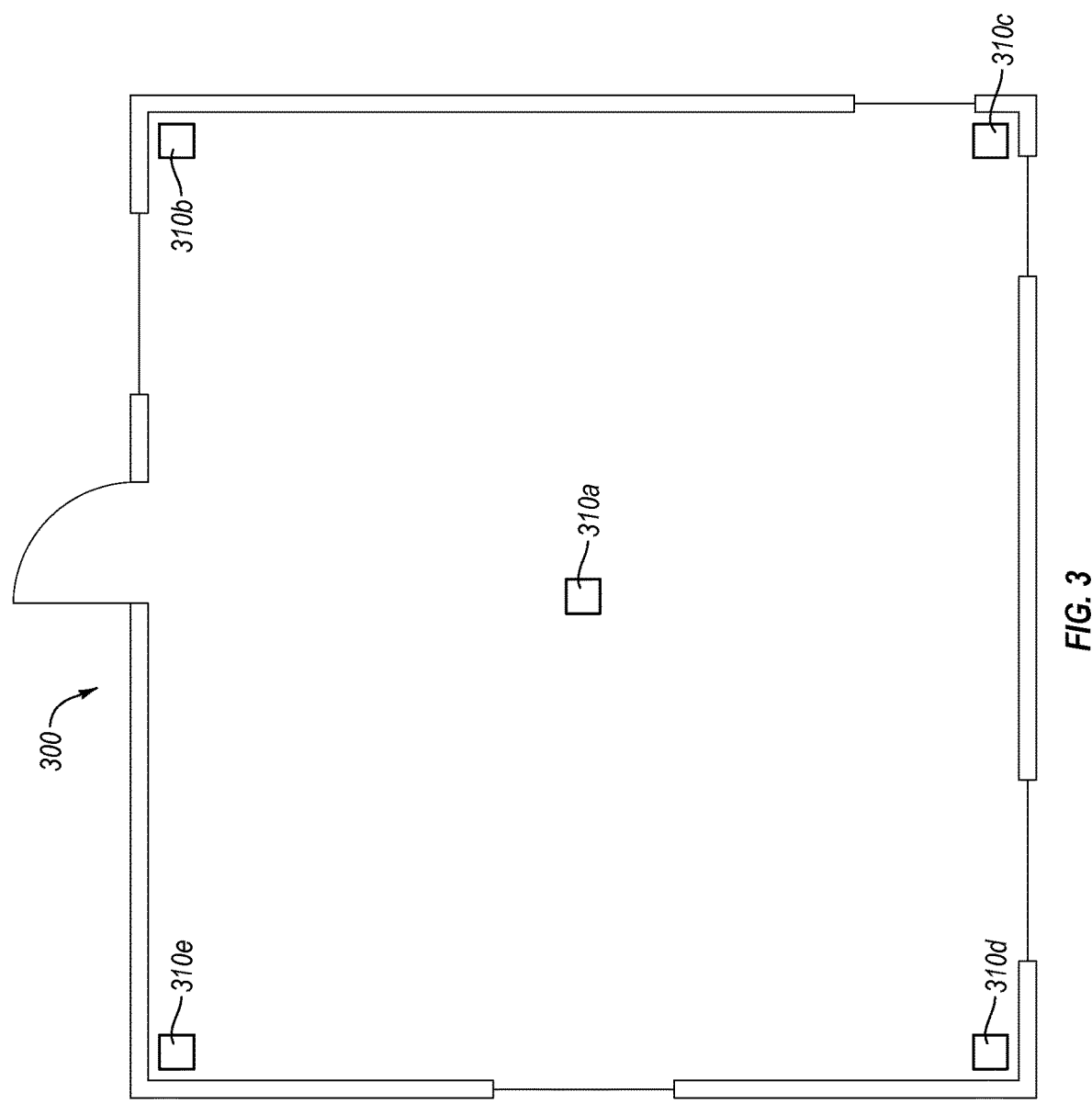
FIG. 3 illustrates a schematic of a gutted studio apartment in accordance with an implementation of the present invention.

Additionally, in at least one implementation, this would allow a designer to overlay a virtual reality architectural design over a gutted space. For example, FIG. 3 depicts a schematic of a gutted space 300. In particular, the studio apartment 200 depicted in FIG. 2 comprises a proposed design for the gutted space 300. In at least one implementation, a designer can set up sensor modules 110, 310(a-e) within the gutted space 300. A client can then be brought into the gutted space 300 and provided with a virtual reality module 100.

Using the virtual reality module 100, the user can travel throughout the gutted space 300 and see a virtual representation of the final studio apartment 200. In at least one implementation, the sensor modules 110, 310(a-e) can identify the user's exact position and view within the gutted room 300 and, accordingly, can provide the user with the proper view. In contrast, in at least one implementation, the sensor modules 110, 310(a-e) are only aware of the user's movement relative to each sensor and are not aware of the user's exact position relative to the gutted space 300. In this implementation, the user may be required to start from a bookmarked location 210(a-f). Then as the user moves the sensor modules 110, 310(a-e) can track the users relative movements, which will correspond to the users location within both the gutted space 300 and the virtual studio apartment 200 because the user started from a common position relative to both the gutted space 300 and the virtual studio apartment 200.

Accordingly, FIGS. 1-3 and the corresponding text illustrate or otherwise describe one or more methods, systems, and/or instructions stored on a storage medium that can provide a virtual reality rendering of a architectural design to a user. One will appreciate that implementations of the present invention can also be described in terms of methods comprising one or more acts for accomplishing a particular result. For example, FIG. 4 and the corresponding text illustrate flowcharts of a sequence of acts in a method for displaying a three-dimensional view of an architectural design to a user through the one or more virtual reality components. The acts of FIG. 4 are described below with reference to the components and modules illustrated in FIGS. 1-3.

Figure 4:
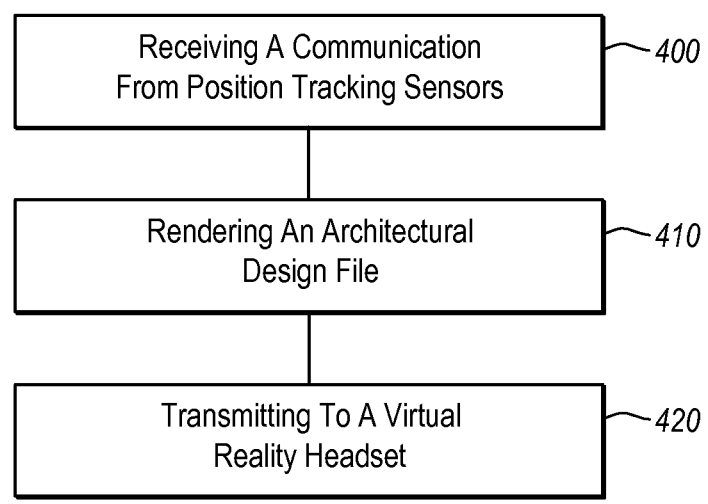
FIG. 4 illustrates a flowchart of a method in accordance with an implementation of the present invention.

For example, FIG. 4 illustrates that an implementation of a method for displaying a three-dimensional view of an architectural design to a user through the one or more virtual reality components can comprise an act 400 of receiving a communication from position tracking sensors. Act 400 includes receiving a communication from the one or more position tracking sensors, wherein the communication comprises an indication of a relative direction that the virtual reality headset is facing. For example, in FIG. 1 and the accompanying description, position module 134 receives communications from sensor modules 110 and/or sensors disposed within the virtual reality module 100. The communications can include various information relating to a user's position and movements. For example, the virtual reality module 100 can communicate information relating to the tilt and rotation of a user's head.

FIG. 4 also shows that the method can comprise an act 410 of rendering an architectural design file. Act 410 includes rendering at least a portion of an architectural design file, wherein the rendered portion of the architectural design file comprises a three-dimensional image that corresponds with the relative direction that the virtual reality headset is facing. For example, FIG. 1 and the accompanying description, depict or otherwise describe a rendering module 144 and a 3D module 132, either of which can render at least a portion of an architectural design file.

Additionally, FIG. 4 shows that the method can comprise an act 420 of transmitting to a virtual reality headset. Act 420 can include transmitting to the virtual reality headset the rendered portion of the architectural design file. For example, in FIG. 1 and the accompanying description, the 3D module 132 transmits rendered views of an architectural design to a virtual reality module 100.

Accordingly, implementations of the present invention provide a user with the ability to see and travel through a virtual reality rendering of an architectural design. Additionally, implementations of the present invention provide a system for overlaying a virtual reality architectural design over an unfinished space that the design corresponds with.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

Embodiments of the present invention may comprise or utilize a special-purpose or general-purpose computer system that includes computer hardware, such as, for example, one or more processors and system memory, as discussed in greater detail below. Embodiments within the scope of the present invention also include physical and other computer-readable media for carrying or storing computer-executable instructions and/or data structures. Such computer-readable media can be any available media that can be accessed by a general-purpose or special-purpose computer system. Computer-readable media that store computer-executable instructions and/or data structures are computer storage media. Computer-readable media that carry computer-executable instructions and/or data structures are transmission media. Thus, by way of example, and not limitation, embodiments of the invention can comprise at least two distinctly different kinds of computer-readable media: computer storage media and transmission media.

Computer storage media are physical storage media that store computer-executable instructions and/or data structures. Physical storage media include computer hardware, such as RAM, ROM, EEPROM, solid state drives ("SSDs"), flash memory, phase-change memory ("PCM"), optical disk storage, magnetic disk storage or other magnetic storage devices, or any other hardware storage device(s) which can be used to store program code in the form of computer-executable instructions or data structures, which can be accessed and executed by a general-purpose or special-purpose computer system to implement the disclosed functionality of the invention.

Transmission media can include a network and/or data links which can be used to carry program code in the form of computer-executable instructions or data structures, and which can be accessed by a general-purpose or special-purpose computer system. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer system, the computer system may view the connection as transmission media. Combinations of the above should also be included within the scope of computer-readable media.

Further, upon reaching various computer system components, program code in the form of computer-executable instructions or data structures can be transferred automatically from transmission media to computer storage media (or vice versa). For example, computer-executable instructions or data structures received over a network or data link can be buffered in RAM within a network interface module (e.g., a "NIC"), and then eventually transferred to computer system RAM and/or to less volatile computer storage media at a computer system. Thus, it should be understood that computer storage media can be included in computer system components that also (or even primarily) utilize transmission media.

Computer-executable instructions comprise, for example, instructions and data which, when executed at one or more processors, cause a general-purpose computer system, special-purpose computer system, or special-purpose processing device to perform a certain function or group of functions. Computer-executable instructions may be, for example, binaries, intermediate format instructions such as assembly language, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The invention may also be practiced in distributed system environments where local and remote computer systems, which are linked (either by hardwired data links, wireless data links, or by a combination of hardwired and wireless data links) to a through network, both perform tasks. As such, in a distributed system environment, a computer system may include a plurality of constituent computer systems. In a distributed system environment, program modules may be located in both local and remote memory storage devices.

Those skilled in the art will also appreciate that the invention may be practiced in a cloud-computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

A cloud-computing model can be composed of various characteristics, such as on-demand self-service, broad network access, resource pooling, rapid elasticity, measured service, and so forth. A cloud-computing model may also come in the form of various service models such as, for example, Software as a Service ("SaaS"), Platform as a Service ("PaaS"), and Infrastructure as a Service ("IaaS"). The cloud-computing model may also be deployed using different deployment models such as private cloud, community cloud, public cloud, hybrid cloud, and so forth.

Some embodiments, such as a cloud-computing environment, may comprise a system that includes one or more hosts that are each capable of running one or more virtual machines. During operation, virtual machines emulate an operational computing system, supporting an operating system and perhaps one or more other applications as well. In some embodiments, each host includes a hypervisor that emulates virtual resources for the virtual machines using physical resources that are abstracted from view of the virtual machines. The hypervisor also provides proper isolation between the virtual machines. Thus, from the perspective of any given virtual machine, the hypervisor provides the illusion that the virtual machine is interfacing with a physical resource, even though the virtual machine only interfaces with the appearance (e.g., a virtual resource) of a physical resource. Examples of physical resources including processing capacity, memory, disk space, network bandwidth, media drives, and so forth.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A virtual reality system, comprising:
   one or more virtual reality components, wherein the one or more virtual reality components comprise: (i) a virtual reality module coupled to a display screen, and (ii) one or more position tracking sensors, wherein the one or more position tracking sensors identify a relative location of a user with respect to a physical space; and
   computer-executable instructions of a design program loaded into memory and processed at a central processing unit to cause the virtual reality system to display a three- dimensional view of an architectural design to the user through the one or more virtual reality components, the computer-executable instructions including instructions that are executable to cause the virtual reality system to perform at least the following:
   access an architectural design file that includes an architectural design that is renderable to create a three-dimensional image of the architectural design, wherein the architectural design comprises a design for a particular physical space;

receive a communication from the one or more position tracking sensors, wherein the communication comprises an indication of a relative direction that the virtual reality module is facing, and a location of the user with respect to the one or more position tracking sensors, wherein the user is located within the particular physical space;

associate the user with a first bookmark within the architectural design file, wherein:
- the first bookmark comprises a virtual pre-determined position and virtual view direction within the architectural design file,
- the first bookmark is associated with a particular physical location and physical view direction within the particular physical space,
- the particular physical location and the virtual pre-determined position comprising the same relative position within the architectural design file and an architectural space surrounding the user, and
- the physical view direction and the virtual view direction comprising the same relative view direction within the architectural design file and the architectural space surrounding the user;

render at least a portion of an architectural design file, wherein the rendered portion of the architectural design file comprises a three-dimensional image that corresponds with the relative direction that the virtual reality module is facing; and transmit to the virtual reality module the rendered portion of the architectural design file.

2. The virtual reality system as recited in claim 1, wherein the computer-executable instructions further include instructions that are executable to cause the virtual reality system to:
identify a second bookmark within the architectural design file; and
transmit to the virtual reality headset a rendered portion of the architectural design file that corresponds with the second bookmark.

3. The virtual reality system as recited in claim 2, wherein the computer-executable instructions further include instructions that are executable to cause the virtual reality system to:
transition a user's view within the virtual reality module directly from the first bookmark to the second bookmark when receiving a communication associated with changing the user's physical position from the first bookmark to the second bookmark.

4. The virtual reality system as recited in claim 1, wherein the computer-executable instructions further include instructions that are executable to cause the virtual reality system to:
identify through the one or more position tracking sensors that the user has changed physical positions;
render a corresponding change for the user within the three-dimensional view of the architectural design; and
transmit the corresponding change to the virtual reality module.

5. The virtual reality system as recited in claim 4, wherein identifying through the one or more position tracking sensors that the user has changed physical positions comprises determining a change in at least one of:
a direction in which the user has moved;
a direction that the user is facing;
a tilt of the user's head; and
a position of the user's head.

6. The virtual reality system as recited in claim 5, wherein determining the change in the position of the user's head comprises determining that the user is in a crouched position.

7. The virtual reality system as recited in claim 6, wherein the at least a portion of the architectural design file is rendered such that a view of the user is from a perspective of a crouched position in response to determining that the user is in the crouched position.

8. A method, implemented at a computer system that includes one or more processors, for displaying a three-dimensional view of an architectural design to a user through one or more virtual reality components, the method comprising:
accessing an architectural design file that includes an architectural design that is renderable to create a three-dimensional image of the architectural design, wherein the architectural design comprises a design for a particular physical space;
receiving a communication from one or more position tracking sensors, wherein the communication comprises an indication of a relative direction that a virtual reality module is facing, and a location of the user with respect to the one or more position tracking sensors, wherein the user is located within the particular physical space, wherein the virtual reality module is coupled to a display screen;
associating the user with a first bookmark within the architectural design file, wherein:
- the first bookmark comprises a virtual pre-determined position and virtual view direction within the architectural design file,
- the first bookmark is associated with a particular physical location and physical view direction within the particular physical space,
- the particular physical location and the virtual pre-determined position comprising the same relative position within the architectural design file and the architectural space surrounding the user, and
- the physical view direction and the virtual view direction comprising the same relative view direction within the architectural design file and the architectural space surrounding the user;

rendering at least a portion of the architectural design file, wherein the rendered portion of the architectural design file comprises a three-dimensional image that corresponds with the relative direction that the virtual reality module is facing; and transmitting to the virtual reality module the rendered portion of the architectural design file.

9. The method as recited in claim 8, further comprising:
identifying a second bookmark within the architectural design file, the second bookmark comprising a second pre-determined position and a second view within the architectural design file; and
transmitting to the virtual reality module a rendered portion of the architectural design file that corresponds with the second bookmark.

10. The method as recited in claim 9, further comprising:
transitioning a user's view within the virtual reality module directly from the first bookmark to the second bookmark when receiving a communication associated with changing the user's physical position from the first bookmark to the second bookmark.

11. The method as recited in claim 8, further comprising:
identifying through the one or more position tracking sensors that the user has changed physical positions;

rendering a corresponding change for the user within the three-dimensional view of the architectural design; and
transmitting the corresponding change to the virtual reality module.

12. The method as recited in claim 11, wherein identifying through the one or more position tracking sensors that the user has changed physical positions comprises determining a change in at least one of:
a direction in which the user has moved;
a direction that the user is facing;
a tilt of the user's head; and
a position of the user's head.

13. The method as recited in claim 12, wherein determining the change in the position of the user's head comprises determining that the user is in a crouched position.

14. The method as recited in claim 13, wherein the at least a portion of the architectural design file is rendered such that a view of the user is from a perspective of a crouched position in response to determining that the user is in the crouched position.

15. A computer program product comprising one or more non-transitory computer-readable storage devices having stored thereon one or more computer-executable instructions that are executable by one or more processors of a virtual reality system to cause the virtual reality system to display a three-dimensional view of an architectural design to a user through one or more virtual reality components comprising a virtual reality module and one or more position tracking sensors, the one or more computer-executable instructions including instructions that are executable to cause the virtual reality system to perform at least the following:
access an architectural design file that includes an architectural design that is renderable to create a three-dimensional image of the architectural design, wherein the architectural design comprises a design for a particular physical space;
receive a communication from the one or more position tracking sensors, wherein the communication comprises an indication of a relative direction that the virtual reality module is facing, and a location of the user with respect to the one or more position tracking sensors, wherein the user is located within the particular physical space, wherein the virtual reality module is coupled to a display screen;
associate the user with a first bookmark within the architectural design file, wherein:

the first bookmark comprises a virtual pre-determined position and virtual view within the architectural design file,
the first bookmark is associated with a particular physical location and physical view within the particular physical space, and
the particular physical location and the virtual pre-determined position comprising the same relative position within the architectural design file and an architectural space surrounding the user;
render at least a portion of an architectural design file, wherein the rendered portion of the architectural design file comprises a three-dimensional image that corresponds with the relative direction that the virtual reality module is facing; and
transmit to the virtual reality module the rendered portion of the architectural design file.

16. The computer program product as recited in claim 15, wherein the one or more computer-executable instructions further include instructions that are executable to cause the virtual reality system to:
identify a second bookmark within the architectural design file, the second bookmark comprising a second pre-determined position and a second view within the architectural design file; and
transmit to the virtual reality module a rendered portion of the architectural design file that corresponds with the second bookmark.

17. The computer program product as recited in claim 16, wherein the one or more computer-executable instructions further include instructions that are executable to cause the virtual reality system to:
transition a user's view within the virtual reality module directly from the first bookmark to the second bookmark when receiving a communication, associated with changing the user's physical position from the first bookmark to the second bookmark.

18. The virtual reality system as recited in claim 1, wherein the virtual reality module comprises a virtual reality headset.

19. The method as recited in claim 8, wherein the virtual reality module comprises a virtual reality headset.

20. The computer program product as recited in claim 15, wherein the virtual reality module comprises a virtual reality headset.

* * * * *

UNITED STATES PATENT AND TRADEMARK OFFICE
CERTIFICATE OF CORRECTION

PATENT NO.           : 10,783,284 B2                                    Page 1 of 1
APPLICATION NO.      : 15/518378
DATED                : September 22, 2020
INVENTOR(S)          : Barrie Loberg et al.

It is certified that error appears in the above-identified patent and that said Letters Patent is hereby corrected as shown below:

In the Claims

Column 11
Claim 2, Line 38, change "headset" to --module--

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*